Robert W. Haisty
INVENTOR

BY John G. Graham

ATTORNEY

Aug. 10, 1965 R. W. HAISTY 3,200,329

CONSTANT CURRENT CIRCUIT USING GALLIUM ARSENIDE DEVICES

Original Filed March 29, 1961 2 Sheets-Sheet 2

Robert W. Haisty
INVENTOR

BY [signature]

ATTORNEY 3,200,329

CONSTANT CURRENT CIRCUIT USING GALLIUM ARSENIDE DEVICES

Robert W. Haisty, Richardson, Tex., assignor to Texas Instruments Incorporated, Dallas, Tex., a corporation of Delaware Original application Mar. 29, 1961, Ser. No. 99,259. Divided and this application Sept. 18, 1963, Ser. No. 314,832
1 Claim. (Cl. 323—94)

This is a division of patent application, Serial No. 99,259, filed March 29, 1961.

This invention relates to gallium arsenide compound semiconductors, and more particularly, to a constant current circuit using gallium arsenide semiconductor devices made from intrinsic-appearing gallium arsenide.

Thermistors and photoresistors have been made from silicon and germanium semiconductor materials as well as from compressed and sintered cadmium sulfide. The characteristic which is of necessity in photo diodes or conductors (sometimes referred to as photoresistors) and thermistors is the ability to change resistivity responsive to changes in temperatures or incident radiation. To obtain semiconductor material of sufficiently high resistivity at room temperatures to act as a changing impedance under the influence of temperature changes or light radiation changes, it is necessary for it to be high purity material, which in the case of silicon would contain not greater than $10^{14}$ impurity atoms per cubic centimeter.

In the prior art it has been recognized that the high purity or refinement of silicon or germanium resulted in intrinsic or high resistivity material which, as temperature increased, exhibited a resistivity decrease. In other words, temperature affords sufficient activation energy to excite the valance electrons into the conduction band thereby decreasing the resistivity of the material. Actually, the activation energy necessary to excite these electrons into the conduction band is dependent on the width of the forbidden energy band gap of the material because different activation energies are required for different band gap materials. For silicon, the thermosensitive or photosensitive range of changing resistivity ends above 300° C. The forbidden energy band gap of silicon is 1.1 electron volts and a substantial number of the electrons will be in the conduction band at 300° C. thereby imparting low resistivity to the silicon.

One technique for making high purity, high resistivity germanium and silicon is the well known process of float zoning. In this method a multiplicity of float zones are passed through the material and the resistivity increases in gradual increments thereby becoming of higher and higher magnitude. To enhance the thermo- and photosensitive properties of silicon, one patentee (Taft, U.S. Patent No. 2,860,219) suggests introducing gold in concentrations less than $10^{17}$ atoms per cu. cm. to provide higher sensitivity to the silicon with reference to resistivity in the range of temperature from minus 80° C. to plus 100° C. The photo conductive effect of the silicon impregnated with gold occurs in the temperature range from −100° C. to −200° C.

The well known group III–V compound semiconductors have been exploited by many for use in fabricating such devices as transistors, diodes, tunnel diodes, etc. The reason for exploiting these materials and, particularly, gallium arsenide is the fact that a greater latitude of operating characteristics can be achieved. For instance, gallium arsenide has a forbidden band gap of 1.35 electron volts. This wide band gap makes it feasible to operate devices at several hundred degrees centigrade higher than either silicon or germanium. Likewise, mobilities of electron carriers are much greater for gallium arsenide than for silicon or germanium. In accordance with the invention, devices such as thermosensitive and photosensitive resistors may be made which will operate at temperatures up to 1000° C. Heretofore one of the major problems involved in making such a device was the impracticability of obtaining high resistivity or intrinsic gallium arsenide. To be intrinsic, gallium arsenide should have total impurity carriers in concentrations not greater than $10^7$ to $10^8$ per cu. cm. which is five or six orders of magnitude lower than high purity silicon. Such purities in gallium arsenide are unknown.

In the present invention, the necessity for obtaining intrinsic or impurity carrier concentrations in the range of $10^7$ or $10^8$ carriers per cu. cm. in gallium arsenide is unnecessary. The invention avoids actual intrinsic gallium arsenide by providing a material which is intrinsic-appearing but does not have low ($10^7$ to $10^8$ carriers per cu. cm.) impurity concentrations. The gallium arsenide of this invention has total impurity concentration of $10^{14}$ to $10^{15}$ carriers per cu. cm., but also has energy levels introduced therein at about .74 electron volt which is very near the Fermi level of actual intrinsic gallium arsenide.

The procedure for obtaining the gallium arsenide material of the invention is described by the following steps. First, the highest purity gallium and the highest purity arsenic obtainable are grown into a crystal of gallium arsenide. The crystal may be either extremely gallium rich or extremely arsenic rich, in other words, of non-stoichiometric proportions. Second, the gallium arsenide crystalline material is float zoned by well known techniques which incrementally increases the resistivity. After a varying number of passes have been made, perhaps five or six, the material suddenly changes from a resistivity range of about 1 ohm cm. to several meg ohm-centimeters. In other words, the gallium arsenide proceeds for a few passes in gradual incremental amounts to increase in resistivity and then all of a sudden its resistivity changes 6 or 7 orders of magnitude. Such change is completely unobserved in the case of silicon and germanium and is something totally unexpected.

Varying theories have been advanced to explain why the gallium arsenide becomes intrinsic-appearing in resistivity when, in fact, the donor or acceptor impurity levels are 6 or 7 orders of magnitude higher than would be considered high purity gallium arsenide or truly intrinsic gallium arsenide.

In the process heretofore mentioned, gallium arsenide compound semiconductor material is obtained having an energy level existing at approximately the center of the band gap. In other words, the gallium arsenide has an activation energy level of approximately .7 electron volt. It is suggested that this middle of the forbidden band gap energy level readily traps electrons from the conduction band thereby increasing its resistivity. Thus, the material is intrinsic-appearing although it is not of the impurity concentration which is considered high-purity gallium arsenide to make it truly an intrinsic material.

Although the precise mechanism occurring in the case of gallium arsenide is unknown, it is theorized that one of three possible occurrences creates the energy level of impurities that centers near the middle of the band gap. The first of these is that the gallium arsenide is non-stoichiometric having either an excess of arsenic or gallium. In this situation it is believed for instance, that the arsenic enters a gallium site in the crystal lattice structure having an energy level near the middle of the band gap of the gallium arsenide. Thus, the arsenic would act as a trapping impurity and cause higher resistivity of the material. Second, the deep lying trap having an activation energy in the middle of the band gap could be caused by elements such as oxygen or iron purposely doped into the gallium arsenide or merely present as a non-excludable impurity during formation of the compound semiconductor. Third, another phenomenon which could cause gallium arsenide to become intrinsic-appearing is the presence of some impurity such as copper, for instance, wherein the heat treating in the float zone process could cause the copper to diffuse to donor impurity sites and pair with the donor impurity thereby essentially neutralizing the electrical effect with a consequent increase in resistivity.

The three theories heretofore mentioned are presented as plausible explanations of why the invention creates high resistivity gallium arsenide which is intrinsic-appearing yet does not have sufficiently low impurity concentrations to be considered truly intrinsic gallium arsenide.

Quite surprisingly it was discovered that float zoning removes to a lower concentration donor or acceptor impurities leaving trapping levels at activation energies of about half the forbidden band gap of gallium arsenide. Thus, the dominating impurities affecting the resistivity of the gallium arsenide are at energy levels of trapping impurities, and cause the material to be intrinsic-appearing, high resistivity. Although donor or acceptor impurity levels are in the gallium arsenide in quantities which would shift the Fermi level above or below the center of the forbidden band gap, the Fermi level of the intrinsic-appearing gallium arsenide remains near the center of the forbidden band gap.

Infrequently, crystals of gallium arsenide, prior to float zoning, will have a high resistivity in the range of 40 to 80 meg. ohm-cm. which could well indicate and support the theory of non-stoichiometry causing high resistivity. Normally, the gallium arsenide is not of sufficiently high resistivity to be useful as thermo-sensitive or photo-sensitive devices since the energy level is not as large as 0.74 e.v. and the carrier lifetime is too short for good photo-conductors. Therefore it is usually necessary to float zone the material to obtain sufficiently resistivity.

In view of the foregoing, it is an object of the present invention to provide a gallium arenside material having a resistivity of about 200 meg. ohm-cm. at room temperature and capable of changing resistivity to 20 kilohm-cm. at a temperature of about 200° C.

It is another object of the present invention to provide a constant current controlling device of gallium arsenide which is sensitive to change in temperature and incident light.

Other objects and advantages of the present invention will be readily apparent as the following detailed description becomes better understood in conjunction with the accompanying drawings wherein.

Figure 3:
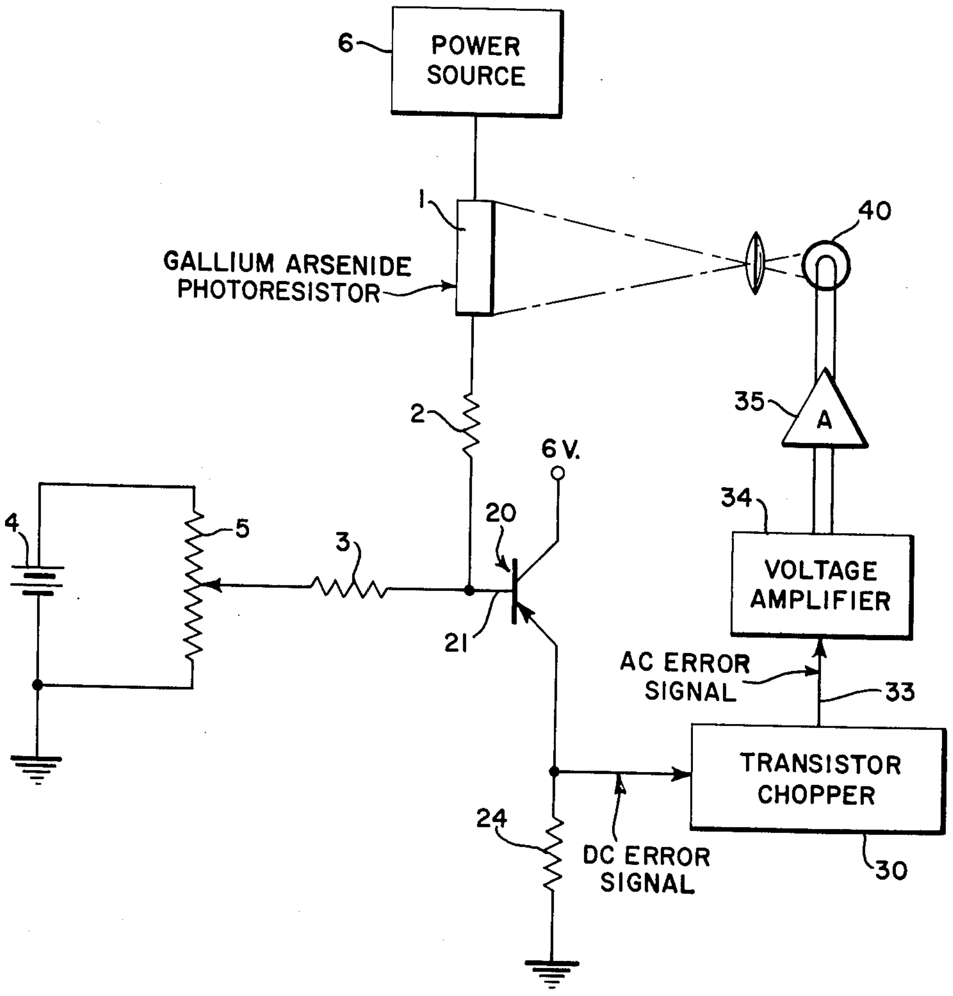

FIGURE 3 schematically illustrates a constant current control device with a gallium arsenide intrinsic-appearing bar as a photoresistor.

Although any known technique may be used for forming suitable gallium arsenide to make the intrinsic-appearing gallium arsenide of the present invention, a specific example of a method of making the gallium arsenide to be float zoned will now be presented.

EXAMPLE I

About 250 grams of gallium having a purity of 99.999 percent gallium was placed in a clean graphite boat. In another clean graphite boat was placed 275 grams of arsensic having a purity of 99.999 percent. Both of the graphite boats were heated to 1000° C. for about 15 minutes prior to placing gallium and arsenic therein. This operation served to clean the graphite boats of impurities. The graphite boat containing gallium was placed at one end of an ampule or bomb tube and the boat containing arsenic at the other end so that each end of the ampule or tube could be maintained at a different temperature. The arsenic located in the ampule was heat treated at 350° C. The ampule or tube was then evacuated and sealed. It should be appreciated that the arsenic could be placed in the bomb tube directly and not in a carbon boat. The section of the tube wherein the gallium was located was heated to 1240° C. and the arsenic area of the tube was heated to 600° C. and maintained at these respective temperatures for approximately 5 hours so that the compound semiconductor gallium arsenide could form. The gallium arsenide was allowed to freeze from one end to the other at a rate of about 1 inch per hour. The first frozen end was cut off and sized to about .3 x .3 x 5½ inches for later float zoning.

The gallium arsenide bar cut to the dimensions above was etched with a solution of 1 part HCl to 2 parts nitric acid diluted 50–50 with water. The bar was rinsed and air-dried at 150° C. for about 30 minutes. This bar was then placed in a tube with excess arsenic, and the tube was then evacuated and sealed. A molten zone was established at the top of the arsenic bar and the arsenic vapor pressure within the tube was supplied and controlled by maintaining an arsenic boiler at 575° C. Five molten passes were made through the sample of gallium arsenide after which time a gallium arsenide single crystal was mounted on top of the sample and six more zone passes were made down through the sample to obtain a single crystal of gallium arsenide.

A resistivity measuring sample was cut from the top portion of the float zoned crystal about .23 x .38 x .12 cm. Resistivity measurements were made at various temperatures from 77° K. to 703° K. The resistivity ranged from a high at 77° K. of $12.9\times10^8$ to a low at 703° K. of $1.34\times10^3$ ohm cm.

Table I below contains data for resistivity at various temperatures recorded on the gallium arsenide compound prepared above.

*Table I*

| Temperature | | Resistivity, ohm.-cm. |
|---|---|---|
| ° C. | ° K. | |
| 23 | 296 | $39.8\times10^6$ |
| 430 | 703 | $1.34\times10^3$ |
| 425 | 698 | $1.61\times10^3$ |
| 420 | 693 | $1.07\times10^3$ |
| 410 | 683 | $8.0\times10^2$ |
| 400 | 673 | $5.35\times10^2$ |
| 390 | 663 | $2.67\times10^3$ |
| 370 | 643 | $2.95\times10^3$ |
| 360 | 633 | $3.22\times10^3$ |
| 350 | 623 | $4.28\times10^3$ |
| 340 | 613 | $5.1\times10^3$ |
| 330 | 603 | $5.98\times10^3$ |
| 320 | 593 | $7.12\times10^3$ |
| 310 | 583 | $7.7\times10^3$ |
| 300 | 573 | $8.4\times10^3$ |
| 280 | 553 | $9.88\times10^3$ |
| 260 | 533 | $2.11\times10^4$ |
| 240 | 513 | $3.98\times10^4$ |
| 220 | 493 | $6.92\times10^4$ |
| 200 | 473 | $1.25\times10^5$ |
| 180 | 453 | $2.08\times10^5$ |
| 160 | 433 | $2.63\times10^5$ |
| 140 | 413 | $3.75\times10^5$ |
| 120 | 393 | $4.15\times10^5$ |
| 90 | 363 | $5.95\times10^5$ |
| 80 | 353 | $7.9\times10^5$ |
| 60 | 333 | $1.9\times10^6$ |
| 20 | 293 | $5.88\times10^7$ |

The resistivity measurements are made by the two point probe method wherein contacts were placed on the surface of the wafer or bar at a given spacing for which the length to cross-sectional area ratio is determined. In this method current is passed through the bar and the voltage drop between the probes is determined from which resistivity can be obtained by multiplying the cross-sectional area to distance between probe ratio by the voltage divided by the current.

Another bar of gallium arsenide was prepared by techniques similar to the ones employed in Example I, and the gallium arsenide Example II resistivity with temperature data is contained in Table II.

*Table II*

| Temperature, ° C. | Resistivity, ohm-cm. |
|---|---|
| 2.5 | $1.17\times10^6$ |
| 50 | $8\times10^5$ |
| 90 | $3.93\times10^5$ |
| 110 | $2.83\times10^5$ |
| 130 | $1.8\times10^5$ |
| 150 | $1.31\times10^5$ |
| 190 | $1.03\times10^5$ |
| Cooling— | |
| 110 | $3.17\times10^5$ |
| 90 | $4.96\times10^5$ |
| 50 | $9.7\times10^5$ |
| 25 | $1.5\times10^6$ |

Example III, another gallium arsenide temperature dependent element was made in a manner similar to those made in Examples I and II above. This element was subjected to repeated temperature cycles to determine the reproducibility of the resistivity at a specific temperature. The results for 8 cycles are contained in Table III whereas the resistivity versus temperature measured after 10 cycles is contained in Table IV. Table III and IV contain columns where the value is a reciprocal of temperature$\times10^3$ and conductivity$\times10^8$.

*Table III*

| Run No. | Resistivity ohm.-cm. | Temperature | | Conductivity mhos$\times10^8$ |
|---|---|---|---|---|
| | | ° K. | $\frac{10^3}{°K.}$ | |
| 1 | $5\times10^4$ | 518 | 1.93 | $2\times10^3$ |
| | $2\times10^4$ | 526 | 1.90 | $5\times10^3$ |
| | $1\times10^4$ | 536 | 1.87 | $1\times10^4$ |
| | $2\times10^3$ | 593 | 1.69 | $5\times10^4$ |
| | $1\times10^3$ | 626 | 1.60 | $1\times10^5$ |
| | $5\times10^2$ | 665 | 1.50 | $2\times10^5$ |
| | $2\times10^2$ | 724 | 1.38 | $5\times10^5$ |
| | $1.5\times10^2$ | 740 | 1.35 | $6.7\times10^5$ |
| | $1\times10^2$ | 785 | 1.27 | $1\times10^6$ |
| | $8\times10$ | 823 | 1.22 | $1.2\times10^6$ |
| | $7\times10$ | 834 | 1.20 | $1.4\times10^6$ |
| 2 | $9\times10$ | 771 | 1.30 | $1.1\times10^6$ |
| | $1\times10^2$ | 759 | 1.32 | $1\times10^6$ |
| | $1.5\times10^2$ | 721 | 1.39 | $6.7\times10^5$ |
| | $2\times10^2$ | 699 | 1.43 | $5\times10^5$ |
| | $8\times10^2$ | 609 | 1.64 | $1.2\times10^5$ |
| | $5\times10^3$ | 543 | 1.84 | $2\times10^4$ |
| | $2\times10^4$ | 487 | 2.05 | $5\times10^3$ |
| | $5\times10^4$ | 467 | 2.14 | $2\times10^3$ |
| | $1\times10^5$ | 449 | 2.23 | $1\times10^3$ |
| | $2\times10^5$ | 433 | 2.31 | $5\times10^2$ |
| 3 | $2\times10^5$ | 444 | 2.25 | $5\times10^2$ |
| | $5\times10^3$ | 559 | 1.79 | $2\times10^4$ |
| | $2\times10^2$ | 593 | 1.69 | $5\times10^5$ |
| | $1\times10^2$ | 762 | 1.31 | $1\times10^6$ |
| | $2\times10^2$ | 693 | 1.44 | $5\times10^5$ |
| | $1\times10^2$ | 756 | 1.32 | $1\times10^6$ |
| | $6\times10$ | 817 | 1.22 | $1.6\times10^6$ |
| 4 | $2\times10^2$ | 700 | 1.43 | $5\times10^5$ |
| | $1.1\times10^2$ | 753 | 1.33 | $9.1\times10^5$ |
| 5 | $1\times10^3$ | 628 | 1.59 | $1\times10^5$ |
| | $3\times10^2$ | 557 | 1.80 | $2\times10^5$ |
| | $2\times10^2$ | 707 | 1.41 | $5\times10^5$ |
| | $8\times10^1$ | 800 | 1.25 | $1.2\times10^6$ |
| | $6\times10^1$ | 833 | 1.20 | $1.6\times10^6$ |
| 6 | $6\times10^1$ | 833 | 1.20 | $1.6\times10^6$ |
| 7 | $7\times10^1$ | 818 | 1.22 | $1.4\times10^6$ |
| | $6\times10^1$ | 835 | 1.20 | $1.6\times10^6$ |
| 8 | $1.5\times10^2$ | 736 | 1.36 | $6.7\times10^5$ |
| | $1\times10^2$ | 770 | 1.30 | $1\times10^6$ |
| | $8\times10$ | 796 | 1.26 | $1.2\times10^6$ |
| | $6\times10$ | 838 | 1.20 | $1.6\times10^6$ |

*Table IV*

| Cycle | Resistivity ohm.-cm. | Temperature | | Conductivity mhos$\times10^3$ |
|---|---|---|---|---|
| | | ° K. | $\frac{10^3}{°K.}$ | |
| 10 | $10^6$ | 390 | 2.56 | $10^2$ |
| | $5\times10^5$ | 426 | 2.35 | $2\times10^2$ |
| | $1.5\times10^5$ | 445 | 2.25 | $6.7\times10^2$ |
| | $1\times10^5$ | 455 | 2.20 | $1\times10^3$ |
| | $5\times10^4$ | 472 | 2.12 | $2\times10^3$ |
| | $4\times10^4$ | 485 | 2.06 | $2.5\times10^3$ |
| | $3\times10^4$ | 489 | 2.04 | $3.3\times10^3$ |
| | $2\times10^4$ | 495 | 2.02 | $5\times10^3$ |
| | $1.5\times10^4$ | 509 | 1.96 | $6.7\times10^3$ |
| | $1\times10^4$ | 524 | 1.91 | $1\times10^4$ |
| | $5\times10^3$ | 549 | 1.82 | $2\times10^4$ |
| | $3\times10^3$ | 563 | 1.78 | $3.3\times10^4$ |
| 2 | $2\times10^3$ | 578 | 1.73 | $5\times10^4$ |
| | $1.5\times10^3$ | 587 | 1.70 | $6.7\times10^4$ |
| | $1\times10^3$ | 604 | 1.66 | $1\times10^5$ |
| | $5\times10^2$ | 640 | 1.56 | $2\times10^5$ |
| | $3\times10^2$ | 671 | 1.49 | $3.3\times10^5$ |
| | $2\times10^2$ | 692 | 1.45 | $5\times10^5$ |
| | $1.5\times10^2$ | 727 | 1.38 | $6.7\times10^5$ |
| | $1\times10^2$ | 765 | 1.31 | $1\times10^6$ |
| | $7\times10^2$ | 789 | 1.27 | $1.4\times10^6$ |
| | $6\times10$ | 807 | 1.24 | $1.6\times10^6$ |
| | $5.5\times10$ | 817 | 1.22 | $1.8\times10^6$ |
| | $5.5\times10$ | 795 | 1.26 | $1.8\times10^6$ |
| | $6.0\times10$ | 781 | 1.28 | $1.6\times10^6$ |
| | $7\times10$ | 762 | 1.31 | $1.4\times10^6$ |
| | $1\times10^2$ | 744 | 1.35 | $1\times10^6$ |
| | $1.5\times10^2$ | 699 | 1.43 | $6.7\times10^5$ |
| | $2\times10^2$ | 676 | 1.48 | $5\times10^5$ |
| | $3\times10^2$ | 645 | 1.55 | $3.3\times10^5$ |
| | $5\times10^2$ | 623 | 1.61 | $2\times10^5$ |
| | $1\times10^3$ | 590 | 1.70 | $1\times10^5$ |
| | $1.5\times10^3$ | 573 | 1.75 | $6.7\times10^4$ |
| | $2\times10^3$ | 563 | 1.78 | $5\times10^4$ |
| | $3\times10^3$ | 548 | 1.82 | $3.3\times10^4$ |
| | $5\times10^3$ | 536 | 1.87 | $2\times10^4$ |
| | $1\times10^4$ | 512 | 1.95 | $1\times10^4$ |
| | $1.5\times10^4$ | 502 | 1.99 | $6.7\times10^3$ |
| | $2\times10^4$ | 492 | 2.03 | $5\times10^3$ |
| | $3\times10^4$ | 482 | 2.07 | $3.3\times10^3$ |
| | $5\times10^4$ | 465 | 2.15 | $2\times10^3$ |
| | $1\times10^5$ | 447 | 2.24 | $1\times10^3$ |

Figure 2:
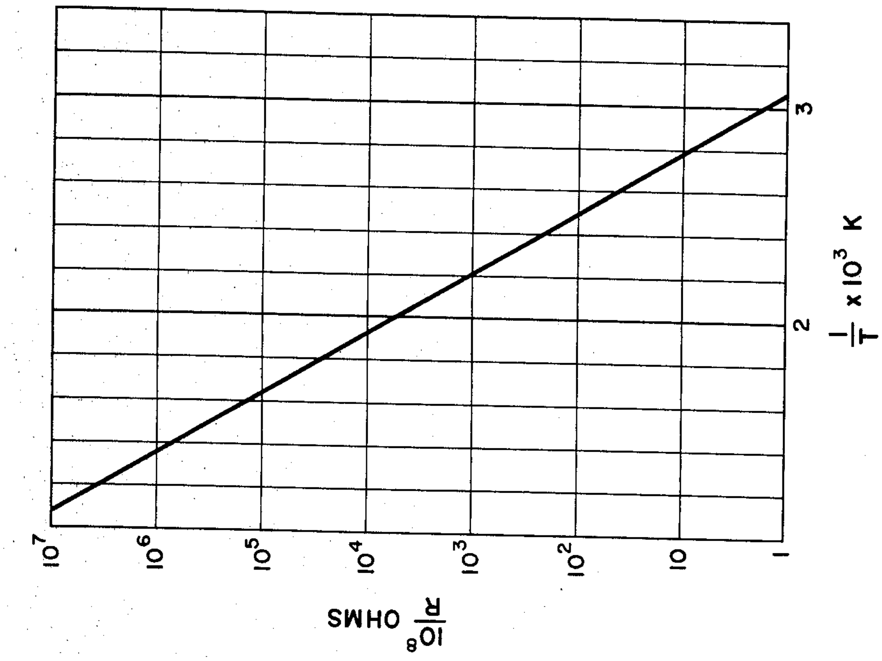
FIGURE 2 illustrates the change in resistance of a device made from intrinsic-appearing gallium arsenide material with respect to change in absolute temperature after 10 cycles of various temperature excursions.
Figure 1:
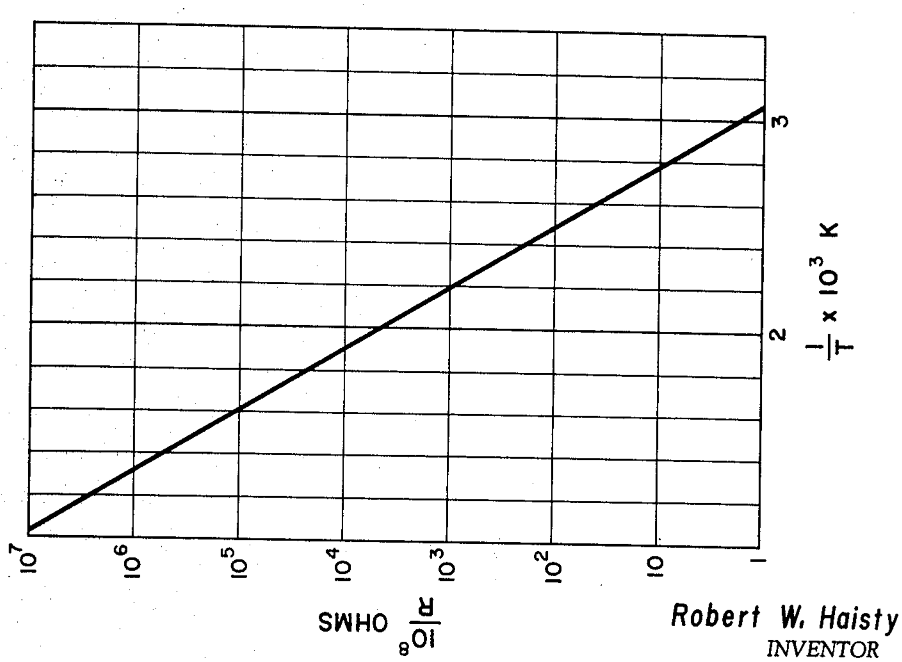
FIGURE 1 illustrates the change in resistance with temperature change of the intrinsic-appearing gallium arsenide material of the present invention having eight different temperature excursions plotted thereon.

To illustrate the linearity of the thermo-sensitive gallium arsenide elements a factor of reciprocal of absolute temperature$\times10^3$ is plotted as an abscissa and the log of conductivity$\times10^8$ is plotted as ordinate. FIGURES 1 and 2 illustrate the linearity of the thermistor through 8 temperature cycles and 10 temperature cycles, respectively.

EXAMPLE IV

Another gallium arsenide temperature dependent element was made in a similar manner to that of Example I. However, 0.015 gm. of $As_2O_3$ was placed in the ampule with arsenic prior to sealing. This procedure resulted in a sample having a deep oxygen trapping level. This sample was not float zoned; however, it was of intrinsic-appearing, high resistivity and temperature dependent. The temperature dependence is disclosed in examination of Table V below.

*Table V*

| Temperature | Resistivity, ohms-cm. | Free Electrons, carriers/cc. |
|---|---|---|
| 105 | $9.03\times10^5$ | $5.54\times10^9$ |
| 152 | $8.04\times10^4$ | $6.24\times10^{10}$ |
| 200 | $1.06\times10^4$ | $4.85\times10^{11}$ |

The activation energy of the trapping level was about 0.74 e.v. for Example IV.

FIGURE 3 illustrates the gallium arsenide element utilized as a photoresistor in an apparatus for maintaining a constant current through a load resistance. The gallium arsenide photoresistor 1 is located in series with a load resistance 2 varying from a nominal amount to 200 meg-ohms and a resistor 3. Photoresistor 1 is further coupled to an adjustable current source consisting of 6½ volt battery 4 with a 100 K potentiometer 5 across it, and a 100 K. resistor 3 in series with the potentiometer output. The other side of the gallium arsenide photoresistor 1 is coupled to a power source 6. A transistor emitter follower 20 has the base lead 21 connected between the resistor 3 and the load resistance 2, the collector connected to a 6-volt D.C. supply and the emitter grounded through resistor 24. The output of transistor 20 is taken from the emitter resistor 24 and coupled into a transistor chopper 30. The output of the transistor chopper is an A.C. error signal 33 which is suitably amplified by voltage amplifier 34, and the output of the voltage amplifier 34 is coupled into a power amplifier 35 which is used to drive lamp 40. In operation the load current is balanced against a set current provided by the current source comprised of battery 4, potentiometer 5, and resistor 3. If the load resistance 2 changes causing an unbalance current, the base 21 of the transistor emitter follower 20 follows the unbalanced current creating an error voltage across the emitter follower resistor 24 developing a D.C. error signal which is coupled to the transistor chopper 30 to increase or decrease the A.C. error signal 33. This A.C. error signal is amplified by voltage amplifier 34 and power amplifier 35 and thereby increases or decreases the intensity of the light 40 which is focused on the photoresistor 1. Increasing light intensity on the photoresistor 1 causes it to undergo a decrease in resistance and decreasing light intensity causes it to increase the resistance of photoresistor 1. In this manner the total resistance of photoresistor 1 and the load resistor 2 is maintained at a constant amount.

As an example of the light sensivity of gallium arsenide material, the gallium arsenide thermistor in Example I was utilized as the photoresistor in the heretofore described circuit. In order to obtain wide variations in load resistance a second gallium arsenide thermistor unit was used which was photo sensitive. This unit was capable of varying in resistance from 140 meg-ohms with room light to .36 meg-ohm under light from a microscope lamp manufactured by Bausch and Lomb, Type 3183–110 at a distance from the lamp to sample of 15 inches and 110 volts operating the light. By various supply voltage settings, the resistivity was varied over the range indicated. The results of varying the load resistance established at 10, 20 and 40 micro amps is contained in Table VI following:

*Table VI*

| Load resistance, ohms | Load current, amps. |
|---|---|
| $1.4 \times 10^8$ | $1 \times 10^{-5}$ |
| $1.4 \times 10^8$ | $1 \times 10^{-5}$ |
| $1.1 \times 10^8$ | $1.01 \times 10^{-5}$ |
| $.44 \times 10^8$ | $1.03 \times 10^{-5}$ |
| $.16 \times 10^8$ | $1.04 \times 10^{-5}$ |
| $.08 \times 10^8$ | $1.04 \times 10^{-5}$ |
| $.04 \times 10^8$ | $1.04 \times 10^{-5}$ |
| $.036 \times 10^8$ | $1.04 \times 10^{-5}$ |
| $.0036 \times 10^8$ | $1.04 \times 10^{-5}$ |
| $1.4 \times 10^8$ | $1.00 \times 10^{-5}$ |
| 0 | $1.04 \times 10^{-5}$ |
| $.44 \times 10^8$ | $2.00 \times 10^{-5}$ |
| $.16 \times 10^8$ | $2.03 \times 10^{-5}$ |
| $.08 \times 10^8$ | $2.03 \times 10^{-5}$ |
| $.0036 \times 10^8$ | $2.03 \times 10^{-5}$ |
| $.44 \times 10^8$ | $2.01 \times 10^{-5}$ |
| $.16 \times 10^8$ | $4.00 \times 10^{-5}$ |
| $.08 \times 10^8$ | $4.01 \times 10^{-5}$ |
| $.04 \times 10^8$ | $4.02 \times 10^{-5}$ |
| $.036 \times 10^8$ | $4.02 \times 10^{-5}$ |
| $.0036 \times 10^8$ | $4.04 \times 10^{-5}$ |
| $.16 \times 10^8$ | $4.01 \times 10^{-5}$ |

It should be appreciated that even though temperature affects the resistivity of the gallium arsenide photoresistor 1, it is unnecessary to provide a compensation in the current controlling circuit for this phenomenon inasmuch as any reason for load resistance change or an effective total change in resistivity including the gallium arsenide photoresistor would merely tend to change the current through the load which would be detected as an error signal and fed to the gallium arsenide photoresistor as an increase or decrease in light intensity thus compensating the resistivity of the controlled gallium arsenide photoresistor 1 providing further control to maintain a constant current. Such results obviously can be understood by studying the data which was conducted with no particular attempt at controlling the temperature.

One of the more important uses for the current controlling gallium arsenide photoresistor and thermistor device in circuits is to make Hall effect and resistivity measurements on materials which have extremely high resistivity at room temperature and below, and whose resistivity decreases rapidly as the temperature is increased. An example of the type material for which resistivity and Hall effect measurements are desired is gallium arsenide which according to the data and the tables presented in the specification herein varies in resistivity from as much as 200 meg-ohms at room temperature to 20,000 ohms at 225° C. It will be appreciated that, first of all, it will be necessary to control the current through a sample during the measurements for Hall effect and resistivity as the temperature is being varied. Furthermore, a rather high voltage will be required to obtain a resonable sample current at lower temperatures. It is desirable to have a sample current of a least $10^{-5}$ ampere for the measurements, therefore, a voltage source of at least 2,000 volts is indicated. This is one feature of the gallium arsenide photoresistor, that it has the ability to withstand extremely high voltages without breakdown.

It should be appreciated that many modifications and changes will become readily apparent to those skilled in the art from the teachings contained herein, and such changes and modifications are deemed to be within the scope of the present invention which is limited only by the appended claim.

What is claimed is:

A circuit for providing a constant current through a load comprising a load resistance, a gallium arsenide photoresistor in series with said load, means for applying a voltage to develop a current through said load resistor, means to apply an opposing current source to exactly equal the current flowing through said load, means to detect a change in current flowing through said load resistor, means to create an error signal responsive to said last named means, and varying light means responsive to said error signal, said varying light means arranged to vary the intensity of light falling on said gallium arsenide photoresistor according to the intensity of said error signal.

References Cited by the Examiner

UNITED STATES PATENTS

| | | | |
|---|---|---|---|
| 3,051,869 | 8/62 | Richards | 315—156 |
| 3,082,381 | 3/63 | Morrill et al. | 330—59 |
| 3,123,724 | 3/64 | Schrenk et al. | 250—205 |

OTHER REFERENCES

Properties of Elemental and Compound Semiconductors; edited by Harry C. Gatos, Interscience Publishers, N.Y., London, Sept. 2, 1959.

LLOYD McCOLLUM, *Primary Examiner.*